US011469779B2

(12) United States Patent
Chen et al.

(10) Patent No.: US 11,469,779 B2
(45) Date of Patent: Oct. 11, 2022

(54) EFFICIENT POLAR CODE CONSTRUCTION IN 5G

(71) Applicant: Telefonaktiebolaget LM Ericsson (publ), Stockholm (SE)

(72) Inventors: Xixian Chen, Ottawa (CA); Qingchao Liu, Ottawa (CA); Yashar Nezami, Ottawa (CA)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 17/271,017

(22) PCT Filed: Sep. 7, 2018

(86) PCT No.: PCT/IB2018/056850
§ 371 (c)(1),
(2) Date: Feb. 24, 2021

(87) PCT Pub. No.: WO2020/049348
PCT Pub. Date: Mar. 12, 2020

(65) Prior Publication Data
US 2021/0328603 A1    Oct. 21, 2021

(51) Int. Cl.
*H03M 13/13*    (2006.01)
*H03M 13/00*    (2006.01)

(52) U.S. Cl.
CPC ......... *H03M 13/618* (2013.01); *H03M 13/13* (2013.01); *H03M 13/6362* (2013.01)

(58) Field of Classification Search
CPC . H03M 13/618; H03M 13/13; H03M 13/6362
See application file for complete search history.

(56) References Cited

U.S. PATENT DOCUMENTS 10,432,234 B2 * 10/2019 Wu ...................... H03M 13/618
10,833,705 B2 * 11/2020 Jiang .................... H03M 13/136
(Continued)

FOREIGN PATENT DOCUMENTS

EP    3273603 A1    1/2018

OTHER PUBLICATIONS

International Search Report and Written Opinion dated May 20, 2019 for International Application No. PCT/IB2018/056850 filed Sep. 7, 2018, consisting of 12-pages.
(Continued)

*Primary Examiner* — Justin R Knapp
(74) *Attorney, Agent, or Firm* — Christopher & Weisberg, P.A.

(57) ABSTRACT

According to some embodiments, a method for polar encoding includes obtaining an input bits index array Q, wherein each element Q[i] is an index of a polar coded transmission channel and corresponds to an input U[i] of a polar encoder. The elements of Q are ordered according to their associated channel quality. The method further includes obtaining an integer number X of bits for polar encoding and wireless transmission, wherein X is not greater than N. Upon determining the polar code block length N is not greater than the number of rate matched bits M available for transmission, the method includes assigning each of the bits as inputs to the polar encoder ordered according to the input bits index array Q.

16 Claims, 8 Drawing Sheets

(56) References Cited

U.S. PATENT DOCUMENTS

| | | | | |
|---|---|---|---|---|
| 10,833,706 B2* | 11/2020 | Kim | ................. | H03M 13/6362 |
| 2020/0259588 A1* | 8/2020 | Iyer | ...................... | H04L 1/0041 |
| 2020/0314779 A1* | 10/2020 | Xie | .................... | H04W 72/042 |
| 2022/0045784 A1* | 2/2022 | Huang | ................. | H03M 13/09 |

OTHER PUBLICATIONS

3GPP TS 38.212 V15.2.0; 3rd Generation Partnership Project; Technical Specification Group Radio Access Network; NR; Multiplexing and channel coding (Release 15), Jun. 2018, consisting of 98-pages.

3GPP TS 38.213 V15.0.0; 3rd Generation Partnership Project; Technical Specification Group Radio Access Network; NR; Physical layer procedures for control (Release 15), Dec. 2017, consisting of 56-pages.

* cited by examiner

EFFICIENT POLAR CODE CONSTRUCTION IN 5G

CROSS-REFERENCE TO RELATED APPLICATIONS

This application is a Submission Under 35 U.S.C. § 371 for U.S. National Stage Patent Application of International Application Number: PCT/IB2018/056850, filed Sep. 7, 2018 entitled "EFFICIENT POLAR CODE CONSTRUCTION IN 5G," the entirety of which is incorporated herein by reference.

TECHNICAL FIELD

Particular embodiments are directed to wireless communications and, more particularly, to efficient polar code construction in fifth generation (5G) new radio (NR).

BACKGROUND

Polar codes, proposed by E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009, achieve the symmetric capacity of the binary-input discrete memoryless channels using a low-complexity successive cancellation (SC) decoder. The finite-length performance of polar codes can be improved by using a list decoder that enables polar codes to approach the performance of the optimal maximum likelihood (ML) decoder (Shannon limits). Furthermore, a polar code concatenated with a simple cyclic redundancy check (CRC) outperforms well-optimized low-density parity check (LDPC) and Turbo codes, even for short block lengths.

Because of the good performance and low complexity of polar codes, the Third Generation Partnership Project (3GPP) has specified polar codes for use with control channels in fifth generation (5G) new radio (NR) standards. The downlink control information (DCI)/physical downlink control channel (PDCCH) and physical broadcast channel (PBCH) are specified with a maximum of 512 bits block and 24 bits CRC. The uplink control information (UCI)/physical uplink control channel (PUCCH) and physical uplink shared channel (PUSCH) are specified with a maximum of 1024 block size with information bits greater than or equal to 12, and with 7 and 11 CRC bits and parity check bits.

Polar coding transforms a pair of identical binary-input channels into two distinct channels of different qualities, one better and one worse than the original binary-input channel By repeating such a pair-wise polarizing operation on a set of $N=2^n$ independent uses of a binary-input channel, a set of $2^n$ "bit-channels" of varying qualities can be obtained. Some of these bit channels are nearly perfect (i.e., error free) while the rest of them are nearly useless (i.e., totally noisy). Polar coding uses the nearly perfect channel to transmit data to the receiver and sets the input to the useless channels to have fixed or frozen values (e.g., 0) known to the receiver.

The input bits to the nearly useless and the nearly perfect channel are commonly referred to as frozen bits and non-frozen (or information) bits, respectively. Only the non-frozen bits are used to carry data in a polar code.

The good and bad channels are polarized based on code construction. Because the code is sensitive to channel types, a code is selected based on all channel types and a compromise. Examples of polar encoding and decoding are illustrated in FIGS. 1 and 2, respectively.

FIG. 1 is a block diagram illustrating a polar encoder processing chain. In the transmit direction, downlink (DL) polar code selection block 10 selects an appropriate polar code based on the type and number of information bits. The time to complete the polar code selection function may be referred to as the code construct latency.

CRC generation block 12 attaches CRC bits. Polar interleaver block 14 performs polar interleaving. Polar interleaving facilitates early decoding termination, which is useful for DCI blind detection. Polar parity check (PC) bits generation block 16 generates polar parity check bits.

Polar encode block 18 encodes the information bits, CRC bits, and parity check bits. The time to complete the polar encoding function may be referred to as encoder latency.

Polar sub-block interleaver block 20 performs sub-block interleaving. Sub-block interleaving facilitates shortening, puncturing, and code construction.

Polar rate matcher block 22 performs rate matching. Coded bit interleaver block 24 performs bit interleaving. Coded bit interleaving improves decoding performance in fading channels (e.g., fading profiles extended pedestrian A (EPA), extended vehicular A (EVA), extended typical urban (ETU)) and high order modulations. The time to complete the functions of block 12 through block 24 may be referred to as the transmit chain latency.

The output of the polar encoder processing chain is modulated using quadrature phase shift keying (QPSK) and transmitted through the air using radio. The receiver processing chain is the reverse of the transmitter. An example is illustrated in FIG. 2.

FIG. 2 is a block diagram illustrating a polar decoder processing chain. In the receive direction, polar code selection block 26 selects a polar code. The time to complete the polar code selection function may be referred to as the code construct latency.

Coded bit deinterleaver block 28 deinterleaves the coded bits. Polar rate dematcher block 30 performs rate dematching. Polar sub-block deinterleaver block 32 performs deinterleaving.

Polar decoder block 34 performs polar decoding. The time to complete the polar decoding function may be referred to as decoder latency.

Polar PC verification block 36 performs a parity check. Polar deinterleaver block 38 performs polar deinterleaving. CRC check block 40 performs CRC checking. The time to complete the functions of block 28 through block 40 may be referred to as the receive chain latency.

SUMMARY

In general, to speed up the Third Generation Partnership Project (3GPP) standard polar code construction, particular embodiments pre-calculate two one-dimensional index arrays for each polar code block length. One of the one-dimensional index arrays is the input bits index array, which is sorted based on channel quality (e.g., the inputs associated with the higher channel qualities come first in the array). The other one-dimensional index array is the sub-block interleaving array, which determines some of the frozen bit positions when the polar code block length is bigger than the total number of raw coded bits.

If the total number of rate matched bits is greater than or equal to the polar code block length, all the output of the polar encoder can be transmitted. Thus, particular embodiments assign the information bits plus cyclic redundancy check (CRC) and parity check (PC) bits to the input bits of the polar encoder in order of their channel qualities.

If the number of rate matched bits is less than the total number of the output coded bits, some of the coded bits are punched or shortened during the rate matching process. As a result, the information bits plus CRC and PC bits cannot be directly assigned to the input bits in order of their channel qualities because some of the input bits are selected as the frozen bits. After determining some of the input bits as the frozen bits, particular embodiments assign the information bits plus CRC and PC bits to the input bits in order of their channel qualities, provided that the locations are not pre-assigned as the frozen bits.

According to some embodiments, a method for use in a wireless transmitter of polar encoding using a polar code block length of N comprises obtaining an input bits index array Q[N], wherein each element Q[i] of the input bits index array is an index of a polar coded transmission channel and corresponds to an input U[i] of a polar encoder. The elements of Q are ordered according to their associated channel quality. The method further comprises obtaining an integer number X of bits $\{b(0), \ldots, b(X-1)\}$ for polar encoding and wireless transmission, wherein X is not greater than N. The method further comprises determining whether the polar code block length N is greater than a number of rate matched bits (M) available for transmission.

Upon determining the polar code block length N is not greater than the number of rate matched bits M available for transmission, the method comprises assigning each of the bits $\{b(0), \ldots, b(X-1)\}$ as inputs to the polar encoder ordered according to the input bits index array Q such that the polar encoding input at index at U[Q[i]]=b(i) for i=0 to X−1 and transmitting the polar encoded bits to a wireless receiver.

In particular embodiments, the method further comprises upon determining the polar code block length N is greater than the number of rate matched bits M available for transmission, obtaining a sub-block interleaving array J[N]. Each element of the sub-block interleaving array J is an index of a corresponding bit position after sub-block interleaving. The method further comprises assigning N-M elements of Q as frozen bits using the sub-block interleaving array and assigning each of the bits $\{b(0), \ldots, b(X-1)\}$ as inputs to the polar encoder ordered according to the input bits index array Q such that the polar encoding input at index U[Q[i]]=b(i) for i=0 to X−1, unless Q[i] is one of the N-M frozen bit elements.

In particular embodiments, assigning N-M elements of Q as frozen bits using the sub-block interleaving array J comprises, upon determining that the ratio of X to M is equal to or below a threshold value (e.g., 0.0.4), removing the last N-M bits after polar sub-block interleaving using the sub-block interleaving array J to determine which elements of Q will be the last N-M bits after polar sub-block interleaving. Upon determining that the ratio of X to M is above the threshold value, the method comprises removing the first N-M bits after polar sub-block interleaving using the sub-block interleaving array J to determine which elements of Q will be the first N-M bits after polar sub-block interleaving.

In particular embodiments, determining whether Q[i] is one of the N-M frozen bit elements comprises obtaining a free position array, freePos[ ], wherein freePos[i] equals Q[i] if Q[i] is not a frozen bit; and assigning (524) each of the bits $\{b(0), \ldots, b(X-1)\}$ as inputs to the polar encoder is based on the free position array.

In particular embodiments, the method comprises determining X by receiving a scheduling request that includes an indication of an amount of data to be transmitted prior to obtaining $\{b(0), \ldots, b(X-1)\}$. At least one of the input bits index array Q and the sub-block interleaving array J may be obtained prior to polar encoding.

According to some embodiments, a wireless transmitter comprises processing circuitry. The processing circuitry is operable to obtain an input bits index array Q[N], wherein each element Q[i] of the input bits index array is an index of a polar coded transmission channel and corresponds to an input U[i] of a polar encoder. The elements of Q are ordered according to their associated channel quality. The processing circuitry is further operable to obtain an integer number X of bits $\{b(0), \ldots, b(X-1)\}$ for polar encoding and wireless transmission, wherein X is not greater than N. The processing circuitry is operable to determine whether the polar code block length N is greater than a number of rate matched bits (M) available for transmission.

Upon determining the polar code block length N is not greater than the number of rate matched bits M available for transmission, the processing circuitry is operable to assign each of the bits $\{b(0), \ldots, b(X-1)\}$ as inputs to the polar encoder ordered according to the input bits index array Q[ ] such that the polar encoding input at index U[Q[i]]=b(i) for i=0 to X−1 and transmit the polar encoded bits to a wireless receiver (110, 120).

In particular embodiments, upon determining the polar code block length N is greater than the number of rate matched bits M available for transmission, the processing circuitry is further operable to obtain a sub-block interleaving array J[N]. Each element of the sub-block interleaving array J is an index of a corresponding bit position after sub-block interleaving. The processing circuitry is further operable to assign N-M elements of Q as frozen bits using the sub-block interleaving array and assign each of the bits $\{b(0), \ldots, b(X-1)\}$ as inputs to the polar encoder ordered according to the input bits index array Q such that the polar encoding input at index U[Q[i]]=b(i) for i=0 to X−1, unless Q[i] is one of the N-M frozen bit elements.

In particular embodiments, to assign N-M elements of Q as frozen bits using the sub-block interleaving array J, the processing circuitry is operable to, upon determining that the ratio of X to M is equal to or below a threshold value (e.g., 0.4), remove the last N-M bits after polar sub-block interleaving using the sub-block interleaving array J to determine which elements of Q will be the last N-M bits after polar sub-block interleaving. Upon determining that the ratio of X to M is above the threshold value, the processing circuitry is operable to remove the first N-M bits after polar sub-block interleaving using the sub-block interleaving array J to determine which elements of Q will be the first N-M bits after polar sub-block interleaving.

In particular embodiments, the processing circuitry is operable to determine whether Q[i] is one of the N-M frozen bit elements by obtaining a free position array, freePos[ ], wherein freePos[i] equals Q[i] if Q[i] is not a frozen bit; and the processing circuitry is operable to assign each of the bits $\{b(0), \ldots, b(X-1)\}$ as inputs to the polar encoder based on the free position array.

In particular embodiments, the processing circuitry is further operable to determine X by receiving a scheduling request that includes an indication of an amount of data to be transmitted prior to obtaining $\{b(0), \ldots, b(X-1)\}$. The processing circuitry may be operable to obtain at least one of the input bits index array Q and the sub-block interleaving array J is obtained prior to polar encoding.

In particular embodiments, the bits $\{b(0), \ldots, b(X-1)\}$ include information bits and CRC bits, and may include parity check bits.

In particular embodiments, the wireless transmitter comprises a network node or a wireless device.

According to some embodiments, a method for use in a wireless receiver of polar decoding using a polar code block length of N comprises obtaining an input bits index array Q[N], wherein each element Q[i] of the input bits index array is an index of a polar coded transmission channel and corresponds to an input U[i] of a polar decoder. The elements of Q are ordered according to their associated channel quality. The method further comprises receiving a wireless signal associated with an integer number X of polar coded bits {b(0), . . . , b(X−1)} from a wireless transmitter for polar decoding, wherein X is not greater than N. The method further comprises determining whether the polar code block length N is greater than a number of received rate matched bits (M);

Upon determining the polar code block length N is not greater than the number of rate matched bits M, the method comprises assigning each of the bits {b(0), . . . , b(X−1)} as inputs to the polar decoder ordered according to the input bits index array Q such that the polar decoding input at index U[Q[i]]=b(i) for i=0 to X−1 and polar decoding the assigned inputs at the polar decoder.

In particular embodiments, the method further comprises upon determining the polar code block length N is greater than the number of rate matched bits M, obtaining a sub-block deinterleaving array J[N], wherein each element of the sub-block deinterleaving array J is an index of a corresponding bit position after sub-block deinterleaving. The method further comprises assigning N-M elements of Q as frozen bits using the sub-block deinterleaving array and assigning each of the bits {b(0), . . . , b(X−1)} as inputs to the polar decoder ordered according to the input bits index array Q such that the polar decoding input at index U[Q[i]]=b(i) for i=0 to X, unless Q[i] is one of the N-M frozen bit elements.

In particular embodiments, assigning N-M elements of Q as frozen bits using the sub-block deinterleaving array J comprises, upon determining that the ratio of X to M is equal to or below a threshold value (e.g., 0.4), removing the last N-M bits before polar sub-block deinterleaving using the sub-block deinterleaving array J to determine which elements of Q were the last N-M bits before polar sub-block deinterleaving. Upon determining that the ratio of X to M is above the threshold value, the method comprises removing the first N-M bits before polar sub-block deinterleaving using the sub-block deinterleaving array J to determine which elements of Q were the first N-M bits before polar sub-block deinterleaving.

In particular embodiments, determining whether Q[i] is one of the N-M frozen bit elements comprises obtaining a free position array, freePos[ ], wherein freePos[i] equals Q[i] if Q[i] is not a frozen bit and assigning each of the bits {b(0), . . . , b(X−1)} as inputs to the polar decoder is based on the free position array.

In particular embodiments, the method further comprises determining X by receiving a scheduling request that includes an indication of an amount of data to be received prior to obtaining {b(0), . . . , b(X−1)}. At least one of the input bits index array Q and the sub-block interleaving array J may be obtained prior to polar decoding.

According to some embodiments, wireless receiver comprises processing circuitry. The processing circuitry is operable to obtain an input bits index array Q[N], wherein each element Q[i] of the input bits index array is an index of a polar coded transmission channel and corresponds to an input U[i] of a polar decoder. The elements of Q are ordered according to their associated channel quality. The processing circuitry is further operable to receive a wireless signal associated with an integer number X of polar coded bits {b(0), . . . , b(X−1)} from a wireless transmitter (110, 120) for polar decoding, wherein X is not greater than N. The processing circuitry is further operable to determine whether the polar code block length N is greater than a number of received rate matched bits (M).

Upon determining the polar code block length N is not greater than the number of rate matched bits M, The processing circuitry is operable to assign each of the bits {b(0), . . . , b(X−1)} as inputs to the polar decoder ordered according to the input bits index array Q such that the polar decoding input at index U[Q[i]]=b(i) for i=0 to X−1 and polar decode the assigned inputs at the polar decoder.

In particular embodiments, upon determining the polar code block length N is greater than the number of rate matched bits M, the processing circuitry is further operable to obtain a sub-block deinterleaving array J[N], wherein each element of the sub-block deinterleaving array J is an index of a corresponding bit position after sub-block deinterleaving. The processing circuitry is further operable to assign N-M elements of Q as frozen bits using the sub-block deinterleaving array and assign each of the bits {b(0), . . . , b(X−1)} as inputs to the polar decoder ordered according to the input bits index array Q such that the polar decoding input at index U[Q[i]]=b(i) for i=0 to X, unless Q[i] is one of the N-M frozen bit elements.

In particular embodiments, to assign N-M elements of Q as frozen bits using the sub-block interleaving array J, the processing circuitry is operable to, upon determining that the ratio of X to M is equal to or below a threshold value (e.g., 0.4), remove the last N-M bits before polar sub-block deinterleaving using the sub-block deinterleaving array J to determine which elements of Q were the last N-M bits before polar sub-block deinterleaving. Upon determining that the ratio of X to M is above the threshold value, the processing circuitry is operable to remove the first N-M bits before polar sub-block deinterleaving using the sub-block deinterleaving array J to determine which elements of Q were the first N-M bits before polar sub-block deinterleaving.

In particular embodiments, the processing circuitry is operable to determine whether Q[i] is one of the N-M frozen bit elements by obtaining a free position array, freePos[ ], wherein freePos[i] equals Q[i] if Q[i] is not a frozen bit; and the processing circuitry is operable to assign each of the bits {b(0), . . . , b(X−1)} as inputs to the polar decoder based on the free position array.

In particular embodiments the processing circuitry is further operable to determine X by receiving a scheduling request that includes an indication of an amount of data to be received prior to obtaining {b(0), . . . , b(X−1)}. At least one of the input bits index array Q and the sub-block interleaving array J may be obtained prior to polar decoding.

In particular embodiments, the bits {b(0), . . . , b(X−1)} include information bits and CRC bits, and may include parity check bits.

In particular embodiments, the wireless receiver comprises a network node or a wireless device.

According to some embodiments, a wireless transmitter comprises an obtaining module, a determining module, and a transmitting module. The obtaining module is operable to obtain an input bits index array Q[N], wherein each element Q[i] of the input bits index array is an index of a polar coded transmission channel and corresponds to an input U[i] of a polar encoder. The elements of Q are ordered according to their associated channel quality. The obtaining module is further operable to obtain an integer number X of bits {b(0), ..., b(X−1)} for polar encoding and wireless transmission, wherein X is not greater than N. The determining module is operable to determine whether the polar code block length N is greater than a number of rate matched bits (M) available for transmission. Upon determining the polar code block length N is not greater than the number of rate matched bits M available for transmission, the determining module is operable to assign each of the bits {b(0), ..., b(X−1)} as inputs to the polar encoder ordered according to the input bits index array Q such that the polar encoding input at index U[Q[i]]=b(i) for i=0 to X. The transmitting module is operable to transmit the polar encoded bits to a wireless receiver.

According to some embodiments, a wireless receiver comprises an obtaining module, a receiving module, a determining module, and a decoding module. The obtaining module is operable to obtain an input bits index array Q[N], wherein each element Q[i] of the input bits index array is an index of a polar coded transmission channel and corresponds to an input U[i] of a polar decoder. The elements of Q are ordered according to their associated channel quality. The receiving module is operable to receive a wireless signal associated with an integer number X of polar coded bits {b(0), ..., b(X−1)} from a wireless transmitter for polar decoding, wherein X is not greater than N. The determining module is operable to determine whether the polar code block length N is greater than a number of received rate matched bits (M). Upon determining the polar code block length N is not greater than the number of rate matched bits M, the determining module is operable to assign each of the bits {b(0), ..., b(X−1)} as inputs to the polar decoder ordered according to the input bits index array Q such that the polar encoding input at index U[Q[i]]=b(i) for i=0 to X. The decoding module is operable to polar decode the assigned inputs at the polar decoder.

Also disclosed is a computer program product. The computer program product comprises instructions stored on non-transient computer-readable media which, when executed by a processor, perform the step of obtaining an input bits index array Q[N], wherein each element Q[i] of the input bits index array is an index of a polar coded transmission channel and corresponds to an input U[i] of a polar encoder. The elements of Q are ordered according to their associated channel quality. The instructions further perform the step of obtaining an integer number X of bits {b(0), ..., b(X−1)} for polar encoding and wireless transmission, wherein X is not greater than N. The instructions further perform the step of determining whether the polar code block length N is greater than a number of rate matched bits (M) available for transmission.

Upon determining the polar code block length N is not greater than the number of rate matched bits M available for transmission, the instructions further perform the steps of assigning each of the bits {b(0), ..., b(X−1)} as inputs to the polar encoder ordered according to the input bits index array Q such that the polar encoding input at index at U[Q[i]]=b(i) for i=0 to X−1 and transmitting the polar encoded bits to a wireless receiver.

Another computer program product comprises instructions stored on non-transient computer-readable media which, when executed by a processor, perform the step of obtaining an input bits index array Q[N], wherein each element Q[i] of the input bits index array is an index of a polar coded transmission channel and corresponds to an input U[i] of a polar decoder. The elements of Q are ordered according to their associated channel quality. The instructions further perform the step of receiving a wireless signal associated with an integer number X of polar coded bits {b(0), ..., b(X−1)} from a wireless transmitter for polar decoding, wherein X is not greater than N. The instructions further perform the step of determining whether the polar code block length N is greater than a number of received rate matched bits (M).

Upon determining the polar code block length N is not greater than the number of rate matched bits M, the instructions further perform the steps of assigning each of the bits {b(0), ..., b(X−1)} as inputs to the polar decoder ordered according to the input bits index array Q such that the polar encoding input at index U[Q[i]]=b(i) for i=0 to X−1 and polar decoding the assigned inputs at the polar decoder.

Certain embodiments of the present disclosure may provide one or more technical advantages. For example, particular embodiments are computationally more efficient than previous polar code constructions (e.g., less CPU cycles). Some embodiments may be forty times faster than the existing solution for polar code construction operation at both the transmitter and the receiver. The CPU cycle saving is particularly useful for fifth generation (5G) networks because the slot time duration is much shorter than in long term evolution (LTE). For LTE, the slot duration is 1 ms. For 5G, the slot duration can be as short as 125 us. Certain embodiments may have none, some, or all of the recited advantages.

BRIEF DESCRIPTION OF THE DRAWINGS

For a more complete understanding of the embodiments and their features and advantages, reference is now made to the following description, taken in conjunction with the accompanying drawings, in which.

DETAILED DESCRIPTION

Third Generation Partnership Project (3GPP) has specified polar codes for use with control channels in fifth generation (5G) new radio (NR) standards. An example polar encoder is illustrated in FIG. 3.

Figure 3:
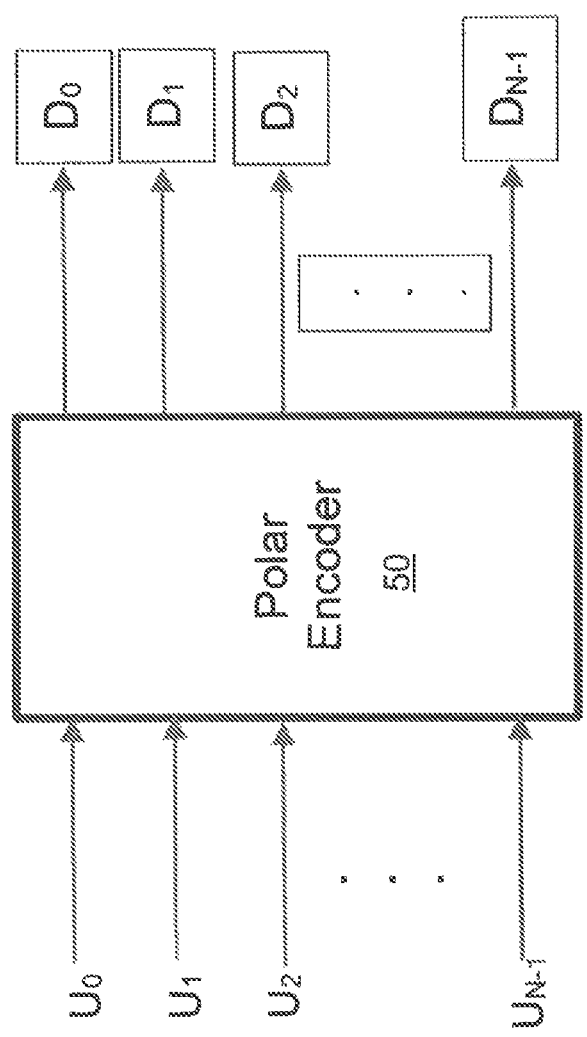
FIG. 3 is a block diagram illustrating an example polar encoder.

FIG. 3 is a block diagram illustrating an example polar encoder. Polar encoder 10 receives input bits, polar encodes the input bits, and outputs the polar encoded bits. The input bits are denoted as $(U_0, U_1, U_2, \ldots, U_{N-1})$ and the output bits are denoted as $(D_0, D_1, D_2, \ldots, D_{N-1})$. The polar code block length N is 2 power n, $N=2^n$.

Polar code construction determines the locations of the information bits plus cyclic redundancy check (CRC) and parity check (PC) bits as well as frozen bits with some conditions. The information bits plus CRC and PC bits are put on the positions with good channel condition, and the frozen bits are put on the positions with bad channel conditions. Each input bit is determined by:

$$U_i = \begin{cases} 0 & \text{(if frozen bit)} \\ \text{information bit or } CRC \text{ bit or } PC \text{ bit} \end{cases}$$

The existing solution for polar code construction is described in 3GPP 38212-f00, Section 5.3.1. The computational complexity of implementing the polar coding algorithm described in Section 5.3.1, however, is prohibitively high for real time requirements.

To speed up the 3GPP standard polar code construction, particular embodiments described herein pre-calculate two one-dimensional index arrays for each polar code block length. One of the one-dimensional index arrays is the input bits index array, which is sorted based on channel quality (e.g., the inputs associated with the higher channel qualities come first in the array). The other one-dimensional index array is the sub-block interleaving array, which determines some of the frozen bit positions when the polar code block length is bigger than the total number of raw coded bits.

If the total number of rate matched bits (i.e., raw coded bits) is greater than or equal to the polar code block length, all the output of the polar encoder can be transmitted. Thus, particular embodiments assign the information bits plus CRC and PC bits to the input bits of the polar encoder in order of their channel qualities.

If the number of rate matched bits is less than the total number of the output coded bits, some of the coded bits are punched or shortened during the rate matching process. As a result, the information bits plus CRC and PC bits cannot be directly assigned to the input bits in order of their channel qualities because some of the input bits are selected as the frozen bits. After determining some of the input bits as the frozen bits, particular embodiments assign the information bits plus CRC and PC bits to the input bits in order of their channel qualities, provided that the locations are not pre-assigned as the frozen bits. Thus, particular embodiments are computationally more efficient than previous polar code constructions.

The following description sets forth numerous specific details. It is understood, however, that embodiments may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments, whether or not explicitly described.

Particular embodiments are described with reference to FIGS. 4-8B of the drawings, like numerals being used for like and corresponding parts of the various drawings. long term evolution (LTE) and NR are used throughout this disclosure as an example cellular system, but the ideas presented herein may apply to other wireless communication systems as well.

Figure 4:
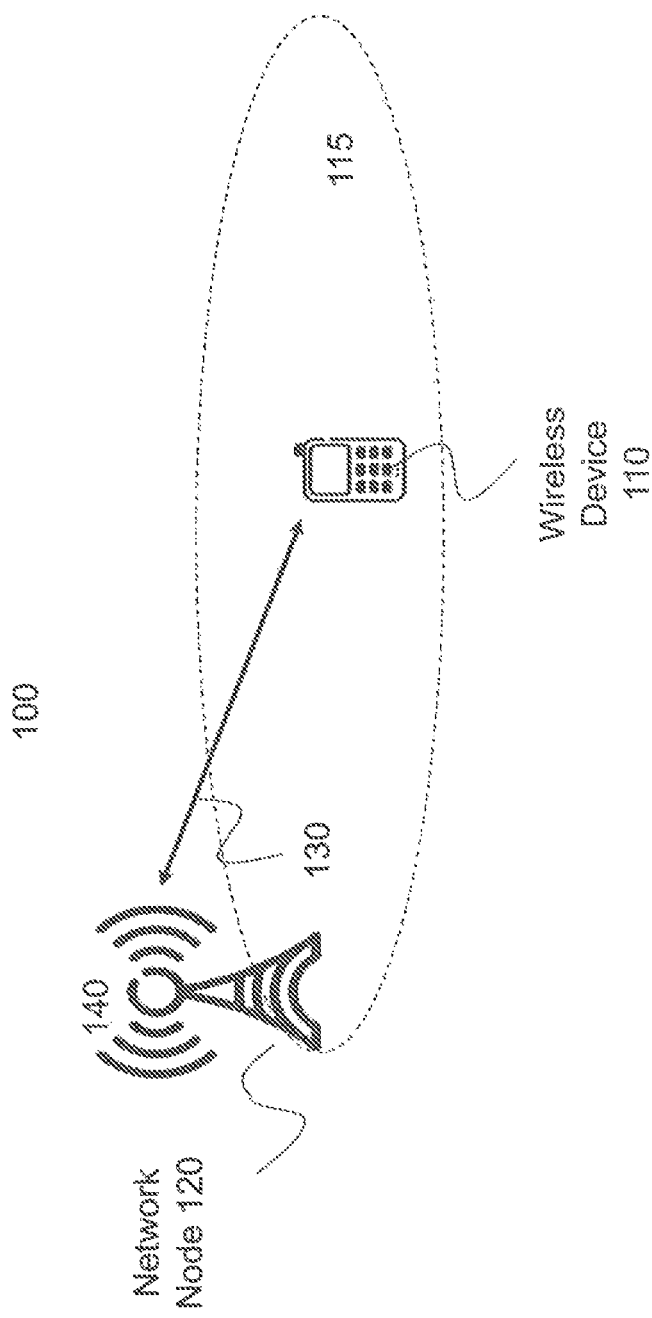
FIG. 4 is a block diagram illustrating an example wireless network, according to some embodiments.

FIG. 4 is a block diagram illustrating an example wireless network, according to a particular embodiment. Wireless network 100 includes one or more wireless devices 110 (such as mobile phones, smart phones, laptop computers, tablet computers, MTC devices, or any other devices that can provide wireless communication) and a plurality of network nodes 120 (such as base stations, eNodeBs, gNBs, etc.). Wireless device 110 may also be referred to as a user equipment (UE). Network node 120 serves coverage area 115 (also referred to as cell 115).

In general, wireless devices 110 that are within coverage of network node 120 (e.g., within cell 115 served by network node 120) communicate with network node 120 by transmitting and receiving wireless signals 130. For example, wireless devices 110 and network node 120 may communicate wireless signals 130 containing voice traffic, data traffic, and/or control signals. A network node 120 communicating voice traffic, data traffic, and/or control signals to wireless device 110 may be referred to as a serving network node 120 for the wireless device 110. Communication between wireless device 110 and network node 120 may be referred to as cellular communication. Wireless signals 130 may include both downlink transmissions (from network node 120 to wireless devices 110) and uplink transmissions (from wireless devices 110 to network node 120).

Each network node 120 may have a single transmitter 140 or multiple transmitters 140 for transmitting signals 130 to wireless devices 110. In some embodiments, network node 120 may comprise a multi-input multi-output (MIMO) system. Similarly, each wireless device 110 may have a single receiver or multiple receivers for receiving signals 130 from network nodes 120 or other wireless devices 110.

Wireless device 110, network node 120, or any other component of network 100 that transmits wireless signals 130 may be referred to as a wireless transmitter. Wireless device 110, network node 120, or any other component of network 100 that receives wireless signals 130 may be referred to as a wireless receiver.

In particular embodiments, wireless signals 130 may be encoded/decoded using a polar code. For example, wireless device 110 and/or network node 120 may use a polar code for encoding wireless signal 130. In some embodiments, the encoding/decoding may include an interleaver/deinterleaver.

Figure 1:
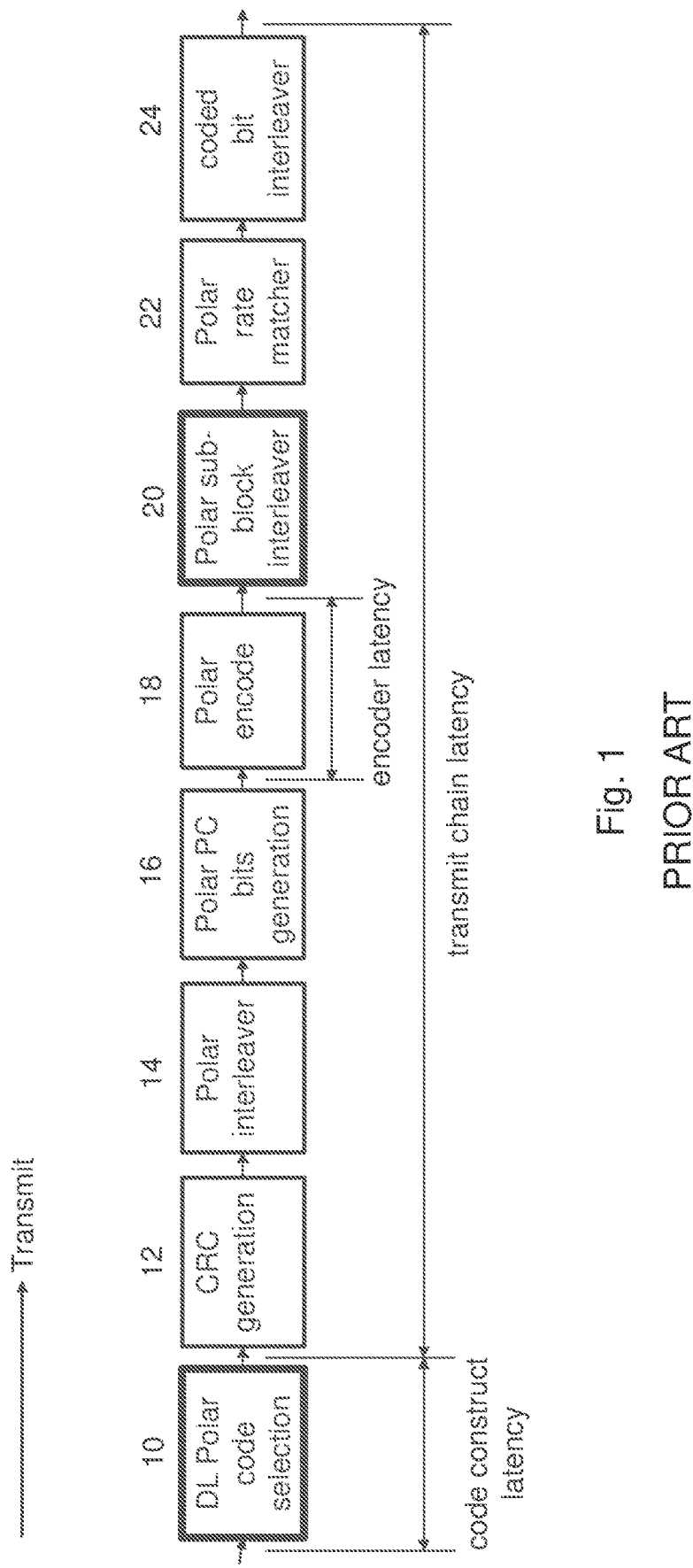
FIG. 1 is a block diagram illustrating a polar encoder processing chain.
Figure 2:
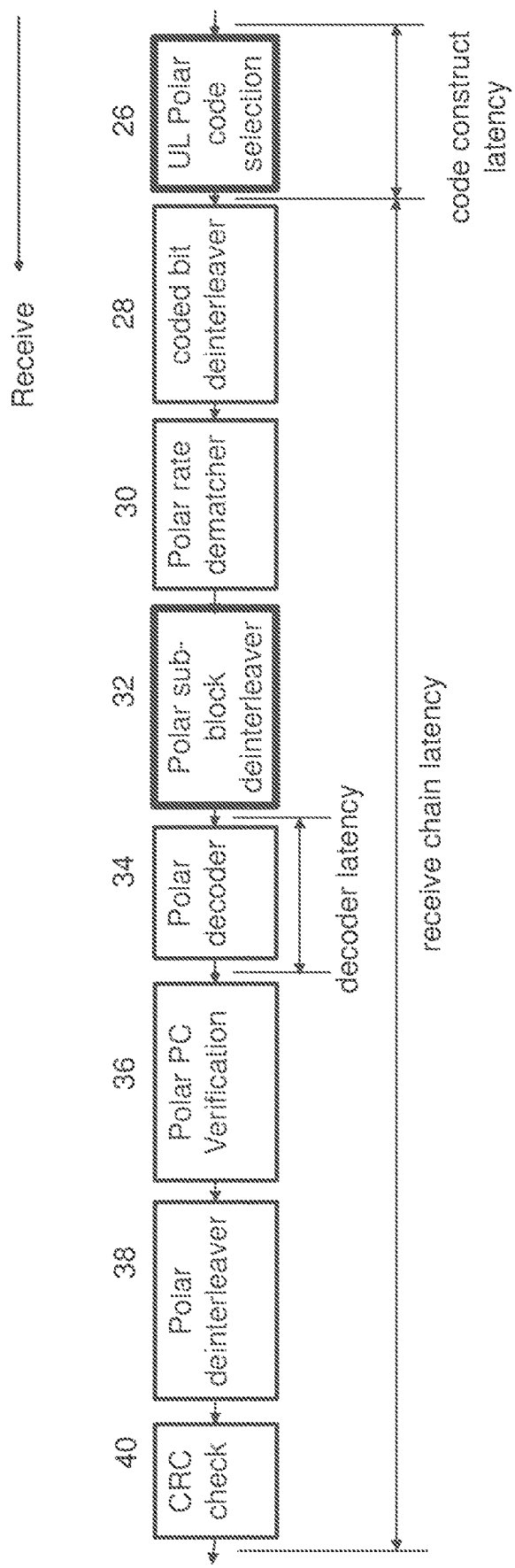
FIG. 2 is a block diagram illustrating a polar decoder processing chain.

For example, wireless device 110 and network node 120 may include transmit chain components such as those illustrated in FIG. 1 and the receive chain components such as those illustrated in FIG. 2. Polar encoding is described in more detail below and with respect to FIGS. 5-6.

In wireless network 100, each network node 120 may use any suitable radio access technology, such as LTE, LTE-Advanced, UMTS, HSPA, GSM, cdma2000, NR, WiMax, WiFi, and/or other suitable radio access technology. Wireless network 100 may include any suitable combination of one or more radio access technologies. For purposes of example, various embodiments may be described within the context of certain radio access technologies. However, the scope of the disclosure is not limited to the examples and other embodiments could use different radio access technologies.

As described above, embodiments of a wireless network may include one or more wireless devices and one or more different types of radio network nodes capable of communicating with the wireless devices. The network may also include any additional elements suitable to support communication between wireless devices or between a wireless device and another communication device (such as a landline telephone). A wireless device may include any suitable combination of hardware and/or software. For example, in particular embodiments, a wireless device, such as wireless device 110, may include the components described with respect to FIG. 7A below. Similarly, a network node may include any suitable combination of hardware and/or software. For example, in particular embodiments, a network node, such as network node 120, may include the components described with respect to FIG. 8A below.

Particular embodiments speed up polar construction (compared to the 3GPP standard calculations) using two one-dimensional index arrays that are pre-calculated for each polar code block length. One array is the input bits index array, which is sorted in the order of the channel quality associated with each polar encoder input. The other is the sub-block interleaving array, which determines some of the frozen bit positions when the polar code block length is bigger than the total number of raw coded bits.

In an embodiment, if the polar code block length is 64, the input bits index array is Q={63, 62, 61, 59, 55, 47, 31, 60, 58, 57, 54, 53, 46, 51, 45, 30, 43, 29, 39, 27, 56, 23, 52, 15, 50, 44, 49, 42, 28, 41, 38, 22, 25, 37, 26, 35, 21, 14, 48, 13, 19, 40, 11, 7, 36, 24, 34, 20, 33, 12, 18, 10, 17, 6, 9, 5, 3, 32, 16, 8, 4, 2, 1, 0}.

And the sub-block interleaving array is

J={0, 1, 2, 3, 4, 5, 8, 9, 6, 7, 10, 11, 12, 13, 14, 15, 16, 17, 32, 33, 18, 19, 34, 35, 20, 21, 36, 37, 22, 23, 38, 39, 24, 25, 40, 41, 26, 27, 42, 43, 28, 29, 44, 45, 30, 31, 46, 47, 48, 49, 50, 51, 52, 53, 56, 57, 54, 55, 58, 59, 60, 61, 62, 63}.

The input bits index array (sorted from highest channel quality to lowest channel quality) shows that $U_{63}$ has the highest channel quality (i.e., Q[0]=63), and $U_0$ has the lowest channel quality (i.e., Q[63]=0). In summary, the input bits index array, Q, is formed such that the channel quality of $U_{63}$, denoted as $Q(U_{63})$ is no less than the channel quality of $U_{62}$, denoted as $Q(U_{62})$, and $Q(U_{62}) \geq Q(U_{61})$, $Q(U_{61}) \geq Q(U_{59})$, ..., $Q(U_1) \geq Q(U_0)$.

The above two one-dimensional arrays are the foundation of polar code construction. As described above, the purpose of polar code construction is to determine the locations of the information bits plus CRC and PC bits as well as frozen bits. The following arrays may be used for polar code construction.

The freePos[ ] array stores the locations of the information bits plus CRC and PC bits in the order of their channel quality. In the freePosMask[ ] array, each element in the array has two values: 0 or 1. If freePosMask[k]=1, it means that the input bit $U_k$ will be assigned as the information bit, CRC bit, or PC bit. If freePosMask[k]=0, it means that the input bit $U_k$ will be assigned as the frozen bit. The following is the formula for assigning the input bits of the polar encoder:

$$U_k = \begin{cases} 0 (\text{frozen bit}) \text{ if } freePosMask[k] = 0 \\ \text{information bit or } CRC \text{ bit or } PC \text{ bit, if } freePosMask[k] = 1 \end{cases}$$

In the pcPosMask[ ] array, each element in the array has two values: 0 or 1. If pcPosMask[k]=1, it means that the input bit $U_k$ will be assigned as PC bit. If pcPosMask[k]=0, it means that the input bit $U_k$ will be assigned as the information bit, CRC bit, or frozen bit.

After obtaining the above three arrays, the polar encoder knows which input bits are used for assigning the information bits plus CRC and PC bits and which input bits can be assigned as the frozen bits.

Let M denote the total number of rate matched bits, N denote the polar code block length, K denote the number of information bits plus CRC bits, and $N_{PC}$ denote the number of PC bits. The following paragraphs describe in more detail how to generate the above three arrays in different scenarios.

In one scenario, the polar code block length is no greater than the number of rate matched bits. Because the total number of rate matched bits is greater than or equal to the polar code block length, all the output of the polar encoder, $(D_0, D_1, D_2, \ldots, D_{N-1})$, can be transmitted. As a result, particular embodiments can assign the information bits plus CRC and PC bits to the input bits in order of their channel qualities. The following is the pseudo code to generate freePos[ ], freePosMask[ ], and pcPosMask[ ]:

```
for (i = 0; i < N; i++) {
    freePos[i] = -1;
    freePosMask[i] = 0;
    pcPosMask[i] = 0;
}
for (i = 0; i < (K + N_PC; i++) {
    freePos[i] = Q[i];
    freePosMask[Q[i]] = 1;
}
for (i = 0; i < Npc; i++) {
    pcPosMask[freePos[i + K]] + 1;
}
For example, if N = 64, K = 15, and N_PC = 3, we get the
following results: freePos[ ] = {63, 62, 61, 59, 55, 47, 31, 60,
58, 57, 54, 53, 46, 51, 45, 30, 43, 29, -1, -1,
-1, -1, -1, . . . , -1}
    freePosMask[i] = 1, if i = 63, 62, 61, 59, 55, 47, 31, 60,
58, 57, 54, 53, 46, 51, 45, 30, 43, 29
    freePosMask[i] = 0, otherwise
    pcPosMask[i] 1, if i = 30, 43, 29
    pcPosMask[i] 0, otherwise
```

In another scenario, the polar code block length is greater than the number of rate matched bits. Because the number of rate matched bits is less than the total number of the output coded bits, some of the coded bits are punched or shortened during the rate matching process. As a result, the information bits plus CRC and PC bits cannot be assigned directly to the input bits in order of their channel qualities because some of the input bits have to be selected as the frozen bits.

For example, if N=64 and M=60, 4 output bits are removed during the rate matching process. As a result, 4 input bits need to be assigned as frozen bits. Because rate matching is performed after polar sub-block interleaving (see FIG. 1), the polar sub-block interleaver impacts the position determination of the input frozen bits. After determining some of the input bits as the frozen bits, the information bits plus CRC and PC bits can be assigned to the input bits in order of their channel qualities, provided that the locations are not pre-assigned as the frozen bits.

Particular embodiments may calculate the following parameters:

float *thr1*=(float)0.4375;

float *thr2*=(float)(*N**0.75);

int limit 1=floor((3**N*–2**M*+3)/4);

int limit2=floor((9**N*–4**M*+15)/16);

and initialize a Qf array:

```
for (i = 0; i < N; i++) {
    Qf[i] = 0;
}
```

In a first example, ((float)K/(float)M)>thr1. In this example, the last (N−M) bits after polar sub-block interleaving are removed (i.e., shortening). Particular embodiments identify which bits are removed before polar sub-block interleaving using the sub-block interleaving array and determine the locations of these removed bits as the input frozen bits. The following is example pseudo code for performing the process:

```
for (i = M; i < N; i++)
{
    Qf[J[i]]= 1;
}
```

J[ ] is the sub-block interleaving array described above. Using Qf[ ], particular embodiments can determine that if Qf[i]=1, i is the location of the frozen input bit.

In a second example, ((float)K/(float)M)<=thr1. In this example, particular embodiments punch out the first (N−M) bits after polar sub-block interleaving and identify which bits are removed before polar sub-block interleaving using the sub-block interleaving array. The locations of the removed bits are the input frozen bits. The following is the pseudo code for performing the process.

```
for (i = 0; i < (N-M); i++)
{
    Qf[J[i]]= 1;
}
```

Depending on the values of M, particular embodiments may assign more input bits as the frozen bits. The following is the pseudo code for performing the process.

```
if ((float)M >= thr2) {
    for (i = 0; i < limit1; i++)
    {
        Qf[i] = 1;
    }
}
else {
    for (i = 0; i < limit2; i++)
    {
        Qf[i] = 1;
    }
}
```

After obtaining Qf[ ] in either case, particular embodiments use the following pseudo code to calculate freePos[ ], freePosMask[ ], and pcPosMask[ ].

```
// Initialization
for (i = 0; i < N; i++) {
    freePos[i] = -1;
    freePosMask[i] = 0;
    pcPosMask[i] = 0;
}
int i = 0;
```

```
int k = 0;
while(i < (K + Npc))
{
    //Check if the location of Q[k] is assigned as the frozen bit or not
    if (Qf[Q[k]] == 0)
    {
        freePos[i] = Q[k];
        freePosMask[Q[k]] = 1;
        i++;
    }
    k++;
}
for (i = 0; i < Npc; i++) {
    pcPosMask[freePos[i + K]] = 1;
}
```

After obtaining freePos[ ], freePosMask[ ], and pcPosMask[ ], particular embodiments may use them for efficient polar encoding. The following is one embodiment of the pseudo code to allocate the input bit sequence of the polar encoder: $U_k$, k=0, 1, 2, . . . , N−1.

```
// Initialization: assign all input bits as frozen bits
for (k = 0; k < N; i++) {
    Uk = 0;
}
// Assign information bits and PC bits
for (i = 0; i < K + Npc; i++) {
    k= freePos[i];
    if(i<K) {
        U_k = [i];
    } else {
        U_k = pc[i-K];
    }
}
```

Where c[k], k=0, 1. 2, . . . , K−1, are the information bits plus CRC bits, and pc[k], k=0, 1, . . . , Npc-1, are the PC bits.

The frozen bit position mask, frozenPosMask[ ], can be easily generated from freePosMask[ ] by element wise exclusive or (XOR) operation.

Although particular examples use the polar code block length of 64, the algorithms described herein can be used for any polar code block length of 2 power n, $N=2^n$. The algorithm for polar code construction may be used for both polar encoding at the transmitter and polar decoding at the receiver. Examples of polar encoding and decoding are illustrated in FIGS. 5 and 6, respectively.

Figure 5:
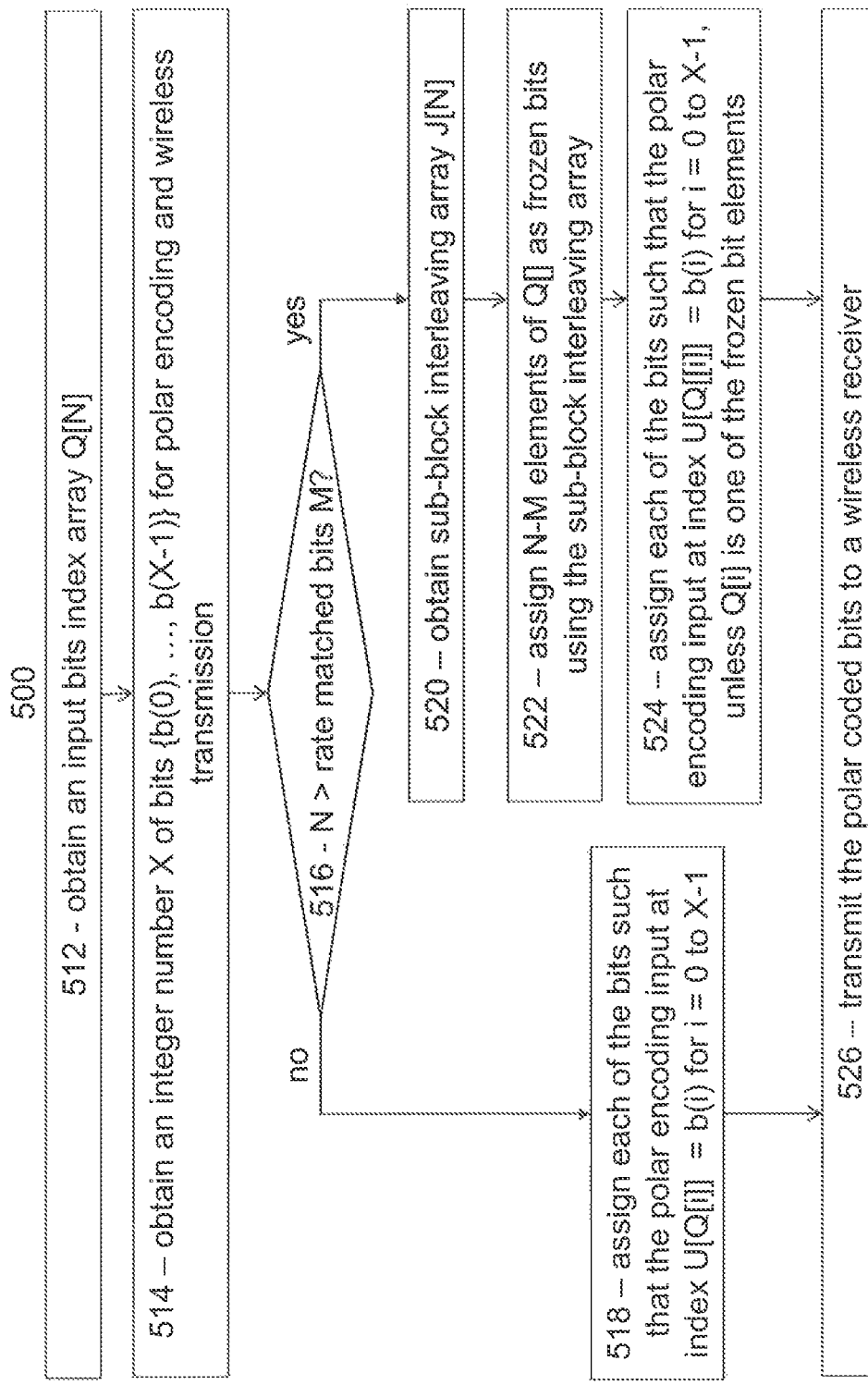
FIG. 5 is a flowchart of an example method in a wireless transmitter, according to some embodiments.
Figure 6:
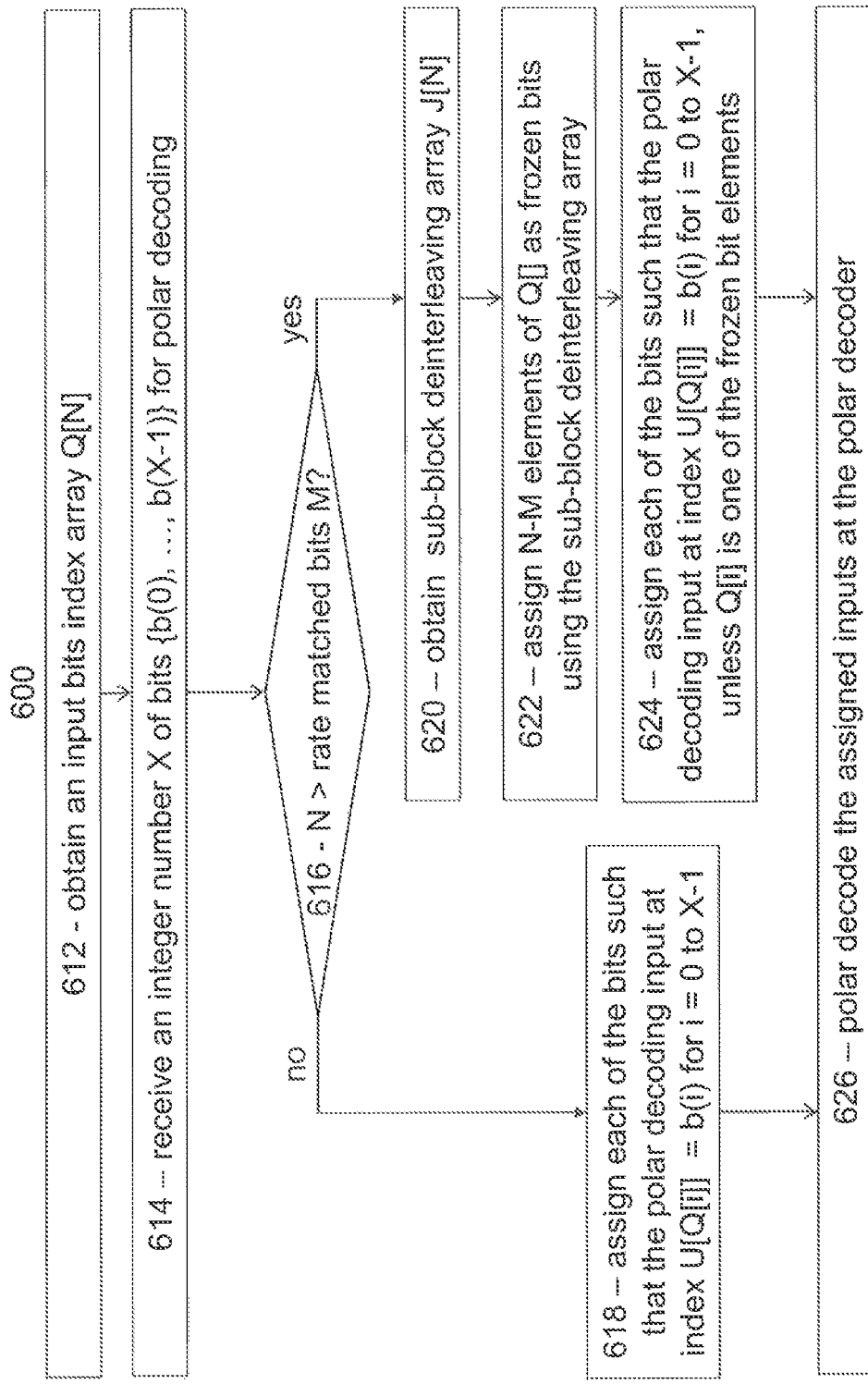
FIG. 6 is a flow diagram illustrating an example method in a wireless receiver, according to some embodiments.

FIG. 5 is a flow diagram illustrating an example method in a wireless transmitter, according to some embodiments. In particular embodiments, one or more steps of FIG. 5 may be performed by wireless device 110 or network node 120 described with respect to FIG. 4.

The method begins at step 512, where the wireless transmitter obtains an input bits index array Q[N], wherein each element Q[i] of the input bits index array is an index of a polar coded transmission channel and corresponds to an input U[i] of a polar encoder. The elements of Q are ordered according to their associated channel quality.

For example, Q may be precalculated based on simulation results and stored in memory. A wireless transmitter may calculate Q based on signal measurements, or the wireless transmitter may receive Q from another network element. For example, network node 120 may calculate the channel qualities using channel state information (CSI) reports, as one example. Wireless device 110 may measure channel qualities or may receive Q from network node 120, or some other suitable component of network 100. In the examples described above, Q is sorted from highest channel quality to lowest channel quality. Other embodiments may reverse the order or use any suitable ordering.

At step 514, the wireless transmitter obtains an integer number X of bits {b(0), . . . , b(X−1)} for polar encoding and wireless transmission. X is not greater than N.

For example, network node 120 may obtain user data or control information for transmission to wireless device 110. The amount of information to transmit may be based on counting a number of bits to transmit or may be based on receiving a scheduling request that includes an indication of an amount of data to be received before receiving the data to transmit, as two non-limiting examples.

At step 516, the wireless transmitter determines whether the polar code block length N is greater than a number of rate matched bits (M) available for transmission. Upon determining the polar code block length N is not greater than the number of rate matched bits M available for transmission, the method continues to step 518.

At step 518, the wireless transmitter assigns each of the bits {b(0), . . . , b(X−1)} as inputs to the polar encoder ordered according to the input bits index array Q[ ] such that the polar encoding input at index U[Q[i]]=b(i) for i=0 to X−1.

Because the total number of rate matched bits M is greater than or equal to the polar code block length N, all the output of the polar encoder, $(D_0, D_1, D_2, \ldots, D_{N-1})$, can be transmitted. The wireless device can assign the information bits (and any CRC and PC bits) to the input bits in order of their channel qualities. Particular embodiments may use one or more of the arrays freePos, freePosMask, and/or pcPosMask as described in any of the examples and pseudocode above.

Returning to step 516, upon determining the polar code block length N is greater than the number of rate matched bits M available for transmission, the method continues to step 520 where the wireless transmitter obtains a sub-block interleaving array J[N], wherein each element of the sub-block interleaving array J is an index of a corresponding bit position after sub-block deinterleaving. Obtaining may comprise calculating, retrieving a stored configuration, or any other suitable process of determining the interleaving pattern of the polar sub block interleaver. For example, network node 120 may obtain preconfigured array J based on its particular polar sub-block interleaver 20.

At step 522, the wireless transmitter assigns N−M elements of Q as frozen bits using the sub-block interleaving array. For example, because the number of rate matched bits is less than the total number of the output coded bits, some of the coded bits are punched or shortened during the rate matching process. As a result, particular embodiments do not directly assign the information bits (and any CRC and PC bits) to the input bits in order of their channel qualities because some of the input bits (i.e., N−M bits) have to be selected as the frozen bits. Because the rate matching process is done after polar sub-block interleaving process, the polar sub-block interleaver also has an impact on determining the positions of the input frozen bits.

Which bits to assign as frozen may depend on various factors. In some embodiments, the wireless transmitter may determine that the ratio of X to M is equal to or below a threshold value (e.g., 0.4). The wireless transmitter may determine that removing the last N−M bits before polar sub-block deinterleaving is beneficial under such a condition and use the sub-block interleaving array J to determine which elements of Q were the last N−M bits before polar sub-block deinterleaving. The bits may be assigned as frozen bits.

In some embodiments, the wireless transmitter may determine that the ratio of X to M is above the threshold value. The wireless transmitter may determine removing the first N−M bits before polar sub-block interleaving is beneficial under such a condition and use the sub-block interleaving array J to determine which elements of Q were the first N−M bits before polar sub-block interleaving. The bits may be assigned as frozen bits. Although particular examples are described, other embodiments may use any suitable condition and any suitable bit location for determining frozen bits. Particular embodiments may use one or more of the arrays J and/or Qf as described above to assign N−M elements of Q as frozen bits.

At step 524, the wireless transmitter assigns each of the bits {b(0), . . . , b(X−1)} as inputs to the polar encoder ordered according to the input bits index array Q such that the polar encoding input at index U[Q[i]]=b(i) for i=0 to X−1, unless Q[i] is one of the N−M frozen bit elements. Particular embodiments may use one or more of the arrays freePos, freePosMask, and/or pcPosMask as described in any of the examples and pseudocode above.

For example, network node 120 may determine whether Q[i] is one of the N−M frozen bit elements by obtaining a free position array, freePos[ ], wherein freePos[i] equals Q[i] if Q[i] is not a frozen bit. Network node 120 may assign each of the bits {b(0), . . . , b(X−1)} as inputs to the polar encoder based on the free position array.

At step 526, the wireless transmitter transmits the polar encoded bits to a wireless receiver. For example, network node 120 may transmit the polar encoded bits to wireless device 110, or wireless device 110 may transmit the polar encoded bits to network node 120 or another wireless device 110.

Modifications, additions, or omissions may be made to method 500. Additionally, one or more steps in method 500 of FIG. 5 may be performed in parallel or in any suitable order. The steps of method 500 may be repeated over time as necessary.

FIG. 6 is a flow diagram illustrating an example method in a wireless receiver of deinterleaving coded soft bits, according to some embodiments. In particular embodiments, one or more steps of FIG. 6 may be performed by wireless device 110 or network node 120 described with respect to FIG. 4.

The method begins at step 612, where the wireless receiver obtains an input bits index array Q[N]. Each element Q[i] of the input bits index array is an index of a polar coded transmission channel and corresponds to an input U[i] of a polar decoder.

For example, Q may be precalculated based on simulation results and stored in memory. A wireless receiver may calculate Q based on signal measurements, or the wireless receiver may receive Q from another network element. For example, network node 120 may calculate the channel qualities using channel state information (CSI) reports, as one example. Wireless device 110 may measure channel qualities or may receive Q from network node 120, or some other suitable component of network 100. In the examples described above, Q is sorted from highest channel quality to lowest channel quality. Other embodiments may reverse the order or use any suitable ordering.

At step 614, the wireless receiver receives a wireless signal associated with an integer number X of polar coded bits {b(0), . . . , b(X−1)} from a wireless transmitter for polar decoding. For example, the wireless receiver may receive the wireless signal transmitted by the wireless transmitter at step 526 of FIG. 5.

At step 616, the wireless receiver determines whether the polar code block length N is greater than a number of received rate matched bits (M). Upon determining the polar code block length N is not greater than the number of rate matched bits M, the method continues to step 618.

At step 618, the wireless receiver assigns each of the bits {b(0), . . . , b(X−1)} as inputs to the polar decoder ordered according to the input bits index array Q[ ] such that the polar decoding input at index U[Q[i]]=b(i) for i=0 to X−1. Particular embodiments may use one or more of the arrays freePos, freePosMask, and/or pcPosMask as described in any of the examples and pseudocode above.

Returning to step 616, upon determining the polar code block length N is greater than the number of received rate matched bits M, the method continues to step 620 where the wireless receiver obtains a sub-block deinterleaving array J[N] (similar to sub-block interleaving array J described above). Each element of the sub-block deinterleaving array J is an index of a corresponding bit position after sub-block deinterleaving. Obtaining may comprise any of the examples described at step 520 of FIG. 5.

At step 622, the wireless receiver assigns N−M elements of Q as frozen bits using the sub-block deinterleaving array. Particular embodiments may determine which N−M element of Q to assign as frozen bits according to any of the examples described at step 522 of FIG. 5.

At step 624, the wireless receiver assigns each of the bits {b(0), . . . , b(X−1)} as inputs to the polar decoder ordered according to the input bits index array Q such that the polar decoding input at index U[Q[i]]=b(i) for i=0 to X, unless Q[i] is one of the N−M frozen bit elements. Particular embodiments may use one or more of the arrays freePos, freePosMask, and/or pcPosMask as described in any of the examples and pseudocode above.

For example, wireless device 110 may determine whether Q[i] is one of the N−M frozen bit elements by obtaining a free position array, freePos[ ], wherein freePos[i] equals Q[i] if Q[i] is not a frozen bit. Wireless device 110 may assign each of the bits {b(0), . . . , b(X−1)} as inputs to the polar decoder based on the free position array.

At step 626, the wireless receiver polar decodes the assigned inputs at the polar decoder. For example, wireless device 110 may decode the assigned inputs at polar decoder 50.

Modifications, additions, or omissions may be made to method 600. Additionally, one or more steps in method 600 of FIG. 6 may be performed in parallel or in any suitable order. The steps of method 600 may be repeated over time as necessary. The steps described in methods 500 and 600 are forty times faster than the current 3GPP specified manner of polar code construction.

Figure 7B:
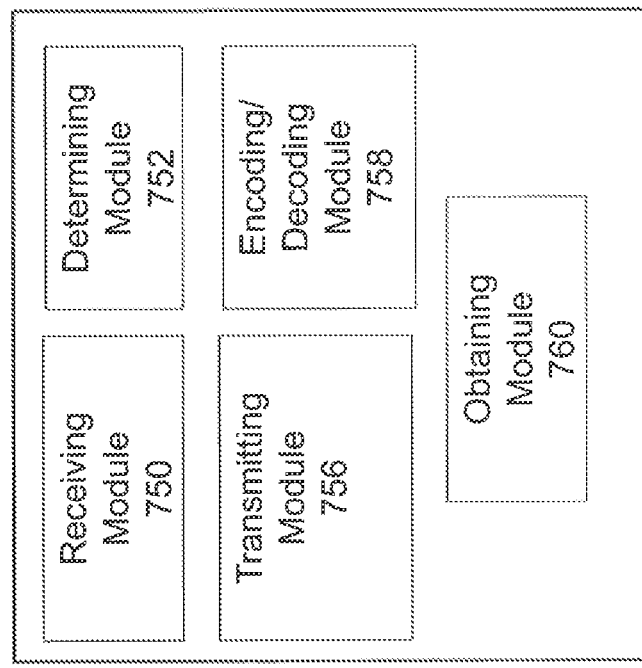
FIG. 7B is a block diagram illustrating example components of a wireless device.
Figure 7A:
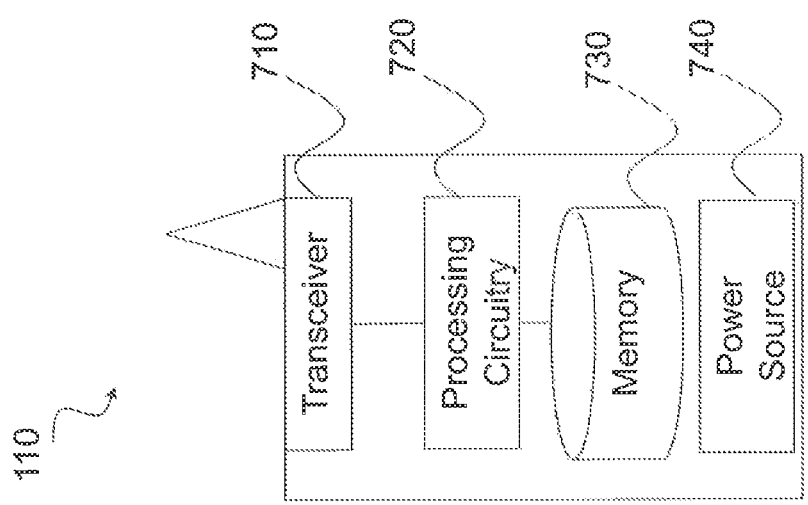
FIG. 7A is a block diagram illustrating an example embodiment of a wireless device.

FIG. 7A is a block diagram illustrating an example embodiment of a wireless device. The wireless device is an example of the wireless devices 110 illustrated in FIG. 4. In particular embodiments, the wireless device is capable of efficiently constructing polar codes.

Particular examples of a wireless device include a mobile phone, a smart phone, a PDA (Personal Digital Assistant), a portable computer (e.g., laptop, tablet), a sensor, a modem, a machine type (MTC) device/machine to machine (M2M) device, laptop embedded equipment (LEE), laptop mounted equipment (LME), USB dongles, a device-to-device capable device, a vehicle-to-vehicle device, or any other device that can provide wireless communication. The wireless device includes transceiver 710, processing circuitry 720, memory 730, and power source 740. In some embodiments, transceiver 710 facilitates transmitting wireless signals to and receiving wireless signals from wireless network node 120 (e.g., via an antenna), processing circuitry 720 executes instructions to provide some or all of the functionality described herein as provided by the wireless device, and memory 730 stores the instructions executed by processing circuitry 720. Power source 740 supplies electrical power to one or more of the components of wireless device 110, such as transceiver 710, processing circuitry 720, and/or memory 730.

Processing circuitry 720 includes any suitable combination of hardware and software implemented in one or more integrated circuits or modules to execute instructions and manipulate data to perform some or all of the described functions of the wireless device. In some embodiments, processing circuitry 720 may include, for example, one or more computers, one more programmable logic devices, one or more central processing units (CPUs), one or more microprocessors, one or more applications, and/or other logic, and/or any suitable combination of the preceding. Processing circuitry 720 may include analog and/or digital circuitry configured to perform some or all of the described functions of wireless device 110. For example, processing circuitry 720 may include resistors, capacitors, inductors, transistors, diodes, and/or any other suitable circuit components.

Memory 730 is generally operable to store computer executable code and data. Examples of memory 730 include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or or any other volatile or non-volatile, non-transitory computer-readable and/or computer-executable memory devices that store information.

Power source 740 is generally operable to supply electrical power to the components of wireless device 110. Power source 740 may include any suitable type of battery, such as lithium-ion, lithium-air, lithium polymer, nickel cadmium, nickel metal hydride, or any other suitable type of battery for supplying power to a wireless device.

Other embodiments of the wireless device may include additional components (beyond those shown in FIG. 7A) responsible for providing certain aspects of the wireless device's functionality, including any of the functionality described above and/or any additional functionality (including any functionality necessary to support the solution described above).

FIG. 7B is a block diagram illustrating example components of a wireless device 110. The components may include receiving module 750, determining module 752, transmitting module 756, encoding/decoding module 758, and obtaining module 760.

Receiving module 750 may perform the receiving functions of wireless device 110. For example, receiving module 750 may receive a wireless signal associated with an integer number X of polar coded bits {b(0), . . . , b(X−1)} for polar decoding, according to any of the examples or embodiments described above (e.g., step 614 of FIG. 6). In certain embodiments, receiving module 750 may include or be included in processing circuitry 720. In particular embodiments, receiving module 750 may communicate with determining module 752, transmitting module 756, encoding/decoding module 758, and obtaining module 760.

Determining module 752 may perform the determining functions of wireless device 110. For example, determining module 752 may determine whether the polar code block length N is greater than a number of rate matched bits and assign bits as input bits of a polar encoder and/or decoder based on any of the embodiments or examples described above (e.g., steps 516, 518, 522 and 524 of FIG. 5 or steps 616, 618, 622 and 624 of FIG. 6). In certain embodiments, determining module 752 may include or be included in processing circuitry 720. In particular embodiments, determining module 752 may communicate with receiving module 750, transmitting module 756, encoding/decoding module 758, and obtaining module 760.

Transmitting module 756 may perform the transmitting functions of wireless device 110. For example, transmitting module 756 may transmit polar encoded bits to a wireless receiver according to any of the examples or embodiments described above (e.g., step 526 of FIG. 5). In certain embodiments, transmitting module 756 may include or be included in processing circuitry 720. In particular embodiments, transmitting module 756 may communicate with receiving module 750, determining module 752, encoding/decoding module 758, and obtaining module 760.

Encoding/decoding module 758 may perform the encoding and/or decoding functions of wireless device 110. For example, encoding/decoding module 758 may encode or decode bits according to any of the examples or embodiments described above (e.g., step 626 of FIG. 6). Some embodiments may only include only an encoding module or only a decoding module. In certain embodiments, encoding/decoding module 758 may include or be included in processing circuitry 720. In particular embodiments, encoding/decoding module 758 may communicate with receiving module 750, determining module 752, transmitting module 756, and obtaining module 760.

Obtaining module 760 may perform the obtaining functions of wireless device 110. For example, obtaining module 760 may obtain bits for encoding or decoding, an input bits index array, and/or a sub-block interleaving array according to any of the examples or embodiments described above (e.g., steps 512, 514 and 520 of FIG. 5 and steps 612 and 620 of FIG. 6). In certain embodiments, obtaining module 760 may include or be included in processing circuitry 720. In particular embodiments, obtaining module 760 may communicate with receiving module 750, determining module 752, encoding/decoding module 758, and transmitting module 756.

Figure 8B:
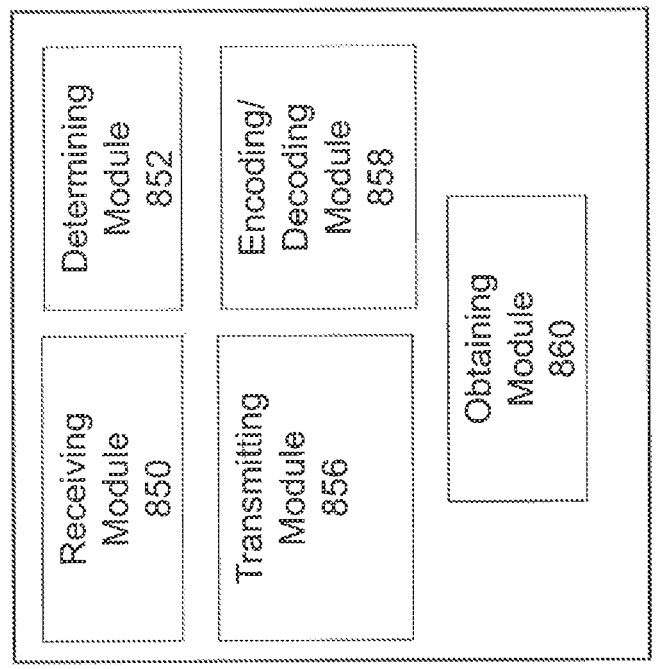
FIG. 8B is a block diagram illustrating example components of a network node.
Figure 8A:
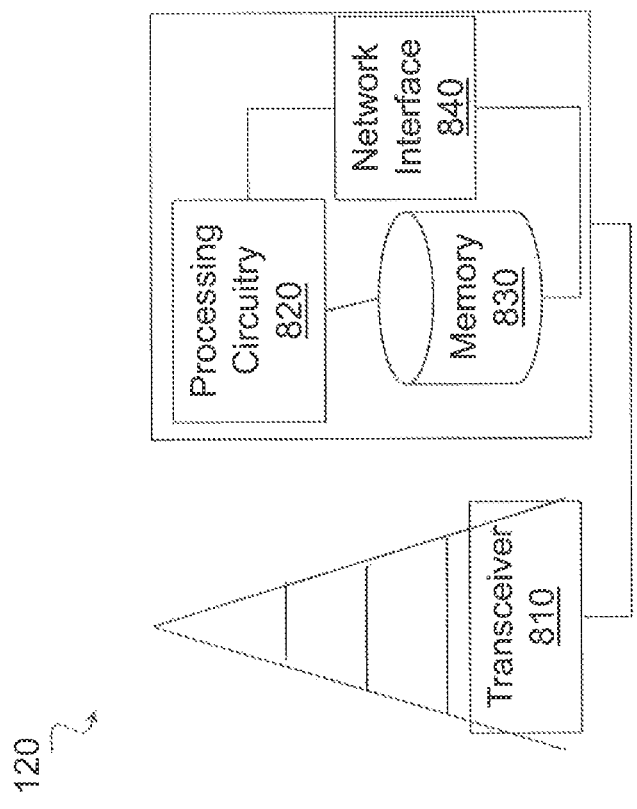
FIG. 8A is a block diagram illustrating an example embodiment of a network node.

FIG. 8A is a block diagram illustrating an example embodiment of a network node. The network node is an example of the network node 120 illustrated in FIG. 4. In particular embodiments, the network node is capable of efficiently constructing polar codes.

Network node 120 can be an eNodeB, a nodeB, gNB, a base station, a wireless access point (e.g., a Wi-Fi access point), a low power node, a base transceiver station (BTS), a transmission point or node, a remote RF unit (RRU), a remote radio head (RRH), or other radio access node. The network node includes at least one transceiver 810, processing circuitry 820, at least one memory 830, and at least one network interface 840. Transceiver 810 facilitates transmitting wireless signals to and receiving wireless signals from a wireless device, such as wireless devices 110 (e.g., via an antenna); processing circuitry 820 executes instructions to provide some or all of the functionality described above as being provided by a network node 120; memory 830 stores the instructions executed by processing circuitry 820; and network interface 840 communicates signals to backend network components, such as a gateway, switch, router, Internet, Public Switched Telephone Network (PSTN), controller, and/or other network nodes 120. Processing circuitry 820 and memory 830 can be of the same types as described with respect to processing circuitry 720 and memory 730 of FIG. 7A above.

In some embodiments, network interface 840 is communicatively coupled to processing circuitry 820 and refers to any suitable device operable to receive input for network node 120, send output from network node 120, perform suitable processing of the input or output or both, communicate to other devices, or any combination of the preceding. Network interface 840 includes appropriate hardware (e.g., port, modem, network interface card, etc.) and software, including protocol conversion and data processing capabilities, to communicate through a network.

Other embodiments of network node 120 include additional components (beyond those shown in FIG. 8A) responsible for providing certain aspects of the network node's functionality, including any of the functionality described above and/or any additional functionality (including any functionality necessary to support the solution described above). The various different types of network nodes may include components having the same physical hardware but configured (e.g., via programming) to support different radio access technologies, or may represent partly or entirely different physical components.

FIG. 8B is a block diagram illustrating example components of a network node 120. The components may include receiving module 850, determining module 852, transmitting module 856, encoding/decoding module 858, and obtaining module 860.

Receiving module 850 may perform the receiving functions of network node 120. For example, receiving module 850 may receive a wireless signal associated with an integer number X of polar coded bits {b(0), . . . , b(X−1)} for polar decoding, according to any of the examples or embodiments described above (e.g., step 614 of FIG. 6). In certain embodiments, receiving module 850 may include or be included in processing circuitry 820. In particular embodiments, receiving module 850 may communicate with determining module 852, transmitting module 856, encoding/decoding module 858, and obtaining module 860.

Determining module 852 may perform the determining functions of network node 120. For example, determining module 852 may determine whether the polar code block length N is greater than a number of rate matched bits and assign bits as input bits of a polar encoder and/or decoder based on any of the embodiments or examples described above (e.g., steps 516, 518, 522 and 524 of FIG. 5 or steps 616, 618, 622 and 624 of FIG. 6). In certain embodiments, determining module 852 may include or be included in processing circuitry 820. In particular embodiments, determining module 852 may communicate with receiving module 850, transmitting module 856, encoding/decoding module 858, and obtaining module 860.

Transmitting module 856 may perform the transmitting functions of network node 120. For example, transmitting module 856 may transmit polar encoded bits to a wireless receiver according to any of the examples or embodiments described above (e.g., step 526 of FIG. 5). In certain embodiments, transmitting module 856 may include or be included in processing circuitry 820. In particular embodiments, transmitting module 856 may communicate with receiving module 850, determining module 852, encoding/decoding module 858, and obtaining module 860.

Encoding/decoding module 858 may perform the encoding and/or decoding functions of network node 120. For example, encoding/decoding module 858 may encode or decode bits according to any of the examples or embodiments described above (e.g., step 626 of FIG. 6). Some embodiments may only include only an encoding module or only a decoding module. In certain embodiments, encoding/decoding module 858 may include or be included in processing circuitry 820. In particular embodiments, encoding/decoding module 858 may communicate with receiving module 850, determining module 852, transmitting module 856, and obtaining module 860.

Obtaining module 860 may perform the obtaining functions of network node 120. For example, obtaining module 860 may obtain bits for encoding or decoding, an input bits index array, and/or a sub-block interleaving array according to any of the examples or embodiments described above (e.g., steps 512, 514 and 520 of FIG. 5 and steps 612 and 620 of FIG. 6). In certain embodiments, obtaining module 860 may include or be included in processing circuitry 820. In particular embodiments, obtaining module 860 may communicate with receiving module 850, determining module 852, encoding/decoding module 858, and transmitting module 856.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the claims below.

Abbreviations used in the preceding description include:
3GPP Third Generation Partnership Project
5G Fifth Generation
BTS Base Transceiver Station
CRC Cyclic Redundancy Check
CSI-RS Channel State Information Reference Signal
D2D Device to Device
DCI Downlink Control Information
DL Downlink
eNB eNodeB
FDD Frequency Division Duplex
IoT Internet-of-Things
LTE Long Term Evolution
M2M Machine to Machine
MCS Modulation and Coding Scheme
MIMO Multi-Input Multi-Output
ML Maximum Likelihood
MTC Machine Type Communication
NR New Radio
OFDM Orthogonal Frequency Division Multiplex
PBCH Physical Broadcast Channel
PC Parity Check
PDCCH Physical Downlink Control Channel
PUCCH Physical Uplink Control Channel
PUSCH Physical Uplink Shared Channel
QPSK Quadrature Phase Shift Keying
RAN Radio Access Network
RAT Radio Access Technology
RB Resource Block
RBS Radio Base Station
RE Resource Element
RNC Radio Network Controller
RRC Radio Resource Control
RRH Remote Radio Head
RRU Remote Radio Unit
RSRP Reference Signal Received Power
RSRQ Reference Signal Received Quality
RS-SINR Reference Signal Signal-to-Interference-plus-Noise Ratio
SC Successive Cancellation
SC-FDMA Single Carrier-Frequency Division Multiple Access
SS System Synchronization
TDD Time Division Duplex
UAV Unmanned Aerial Vehicle
UCI Uplink Control Information
UE User Equipment
UL Uplink
URLLC Ultra-Reliable Low Latency Communication
UTRAN Universal Terrestrial Radio Access Network
WAN Wireless Access Network

The invention claimed is:

1. A method for use in a wireless transmitter of polar encoding using a polar code block length of N, the method comprising:

obtaining an input bits index array Q[N], each element Q[i] of the input bits index array being an index of a polar coded transmission channel and corresponding to an input U[i] of a polar encoder, elements of Q being ordered according to their associated channel quality;

obtaining an integer number X of bits {b(0), . . . , b(X−1)} for polar encoding and wireless transmission, X being not greater than N;

determining whether the polar code block length N is greater than a number of rate matched bits (M) available for transmission;

upon determining the polar code block length N is not greater than the number of rate matched bits M available for transmission, assigning each of the bits {b(0), . . . , b(X−1)} as inputs to the polar encoder ordered according to the input bits index array Q[N] such that the polar encoding input at index at U[Q[i]]= b(i) for i=0 to X−1;

upon determining the polar code block length N is greater than the number of rate matched bits M available for transmission:

obtaining a sub-block interleaving array J[N], wherein each element of the sub-block interleaving array J is an index of a corresponding bit position after sub-block interleaving;

assigning N−M elements of Q as frozen bits using the sub-block interleaving array; and assigning each of the bits {b(0), . . . , b(X−1)} as inputs to the polar encoder ordered according to the input bits index array Q such that the polar encoding input at index U[Q[i]]=b(i) for i=0 to X−1, unless Q[i] is one of the N−M frozen bit elements, at least one of the input bits index array Q and the sub-block interleaving array J is obtained prior to polar encoding; and transmitting the polar encoded bits to a wireless receiver.

2. The method of claim 1, wherein assigning N−M elements of Q as frozen bits using the sub-block interleaving array J comprises:
upon determining that the ratio of X to M is equal to or below a threshold value, removing the last N−M bits after polar sub-block interleaving using the sub-block interleaving array J to determine which elements of Q will be the last N−M bits after polar sub-block interleaving; and
upon determining that the ratio of X to M is above the threshold value, removing the first N−M bits after polar sub-block interleaving using the sub-block interleaving array J to determine which elements of Q will be the first N−M bits after polar sub-block interleaving.

3. The method of claim 2, wherein the threshold value is approximately 0.4.

4. The method of claim 1, wherein determining whether Q[i] is one of the N−M frozen bit elements comprises obtaining a free position array, freePos[ ], wherein freePos[i] equals Q[i] if Q[i] is not a frozen bit; and
assigning each of the bits {b(0), . . . , b(X−1)} as inputs to the polar encoder is based on the free position array.

5. The method of claim 1, wherein the bits {b(0), . . . , b(X−1)} include information bits and cyclic redundancy check (CRC) bits.

6. The method of claim 5, wherein the bits {b(0), . . . , b(X−1)} further include parity check bits.

7. The method of claim 1, further comprising determining X by receiving a scheduling request that includes an indication of an amount of data to be transmitted prior to obtaining {b(0), . . . , b(X−1)}.

8. A wireless transmitter comprising processing circuitry, the processing circuitry configured to:
obtain an input bits index array Q[N], each element Q[i] of the input bits index array being an index of a polar coded transmission channel and corresponding to an input U[i] of a polar encoder, the elements of Q are being ordered according to their associated channel quality;
obtain an integer number X of bits {b(0), . . . , b(X−1)} for polar encoding and wireless transmission, wherein X is not greater than N;
determine whether the polar code block length N is greater than a number of rate matched bits (M) available for transmission;
upon determining the polar code block length N is not greater than the number of rate matched bits M available for transmission, assign each of the bits {b(0), . . . , b(X−1)} as inputs to the polar encoder ordered according to the input bits index array Q[N] such that the polar encoding input at index U[Q[i]]=b(i) for i=0 to X−1;
upon determining the polar code block length N is greater than the number of rate matched bits M available for transmission:
obtaining a sub-block interleaving array J[N], wherein each element of the sub-block interleaving array J is an index of a corresponding bit position after sub-block interleaving;
assigning N−M elements of Q as frozen bits using the sub-block interleaving array; and
assigning each of the bits {b(0), . . . , b(X−1)} as inputs to the polar encoder ordered according to the input bits index array Q such that the polar encoding input at index U[Q[i]]=b(i) for i=0 to X−1, unless Q[i] is one of the N−M frozen bit elements, at least one of the input bits index array Q and the sub-block interleaving array J is obtained prior to polar encoding; and
transmit the polar encoded bits to a wireless receiver.

9. A method for use in a wireless receiver of polar decoding using a polar code block length of N, the method comprising:
obtaining an input bits index array Q[N], each element Q[i] of the input bits index array being an index of a polar coded transmission channel and corresponding to an input U[i] of a polar decoder, elements of Q are being ordered according to their associated channel quality;
receiving a wireless signal associated with an integer number X of polar coded bits {b(0), . . . , b(X−1)} from a wireless transmitter for polar decoding, wherein X is not greater than N;
determining whether the polar code block length N is greater than a number of received rate matched bits (M);
upon determining the polar code block length N is not greater than the number of rate matched bits M, assigning each of the bits {b(0), . . . , b(X−1)} as inputs to the polar decoder ordered according to the input bits index array Q[N] such that the polar decoding input at index U[Q[i]]=b(i) for i=0 to X−1;
upon determining the polar code block length N is greater than the number of rate matched bits M:
obtaining a sub-block deinterleaving array J[N], wherein each element of the sub-block deinterleaving array J is an index of a corresponding bit position after sub-block deinterleaving;
assigning N−M elements of Q as frozen bits using the sub-block deinterleaving array; and
assigning each of the bits {b(0), . . . , b(X−1)} as inputs to the polar decoder ordered according to the input bits index array Q such that the polar decoding input at index U[Q[i]]=b(i) for i=0 to X, unless Q[i] is one of the N−M frozen bit elements, at least one of the input bits index array Q and the sub-block interleaving array J is obtained prior to polar decoding; and
polar decoding the assigned inputs at the polar decoder.

10. The method of claim 9, wherein assigning N−M elements of Q as frozen bits using the sub-block deinterleaving array J comprises:
upon determining that the ratio of X to M is equal to or below a threshold value, removing the last N−M bits before polar sub-block deinterleaving using the sub-block deinterleaving array J to determine which elements of Q were the last N−M bits before polar sub-block deinterleaving; and
upon determining that the ratio of X to M is above the threshold value, removing the first N−M bits before polar sub-block deinterleaving using the sub-block deinterleaving array J to determine which elements of Q were the first N−M bits before polar sub-block deinterleaving.

11. The method of claim 10, wherein the threshold value is approximately 0.4.

12. The method of claim 9, wherein determining whether Q[i] is one of the N−M frozen bit elements comprises obtaining a free position array, freePos[ ], wherein freePos[i] equals Q[i] if Q[i] is not a frozen bit; and assigning each of the bits {b(0), ..., b(X−1)} as inputs to the polar decoder is based on the free position array.

13. The method of claim 9, wherein the bits {b(0), ..., b(X−1)} include information bits and cyclic redundancy check (CRC) bits.

14. The method of claim 13, wherein the bits {b(0), ..., b(X−1)} further include parity check bits.

15. The method of claim 9, further comprising determining X by receiving a scheduling request that includes an indication of an amount of data to be received prior to obtaining {b(0), ..., b(X−1)}.

16. A wireless receiver comprising processing circuitry, the processing circuitry configured to:
 obtain an input bits index array Q[N], each element Q[i] of the input bits index array being an index of a polar coded transmission channel and corresponding to an input U[i] of a polar decoder, elements of Q are being ordered according to their associated channel quality;
 receive a wireless signal associated with an integer number X of polar coded bits {b(0), ..., b(X−1)} from a wireless transmitter for polar decoding, X being not greater than N;
 determine whether the polar code block length N is greater than a number of received rate matched bits (M); and
 upon determining the polar code block length N is not greater than the number of rate matched bits M, assign each of the bits {b(0), ..., b(X−1)} as inputs to the polar decoder ordered according to the input bits index array Q[N] such that the polar decoding input at index U[Q[i]]=b(i) for i=0 to X−1; p1 upon determining the polar code block length N is greater than the number of rate matched bits M:
 obtaining a sub-block deinterleaving array J[N], wherein each element of the sub-block deinterleaving array J is an index of a corresponding bit position after sub-block de interleaving;
 assigning N−M elements of Q as frozen bits using the sub-block deinterleaving array; and
 assigning each of the bits {b(0), ..., b(X−1)} as inputs to the polar decoder ordered according to the input bits index array Q such that the polar decoding input at index U[Q[i]]=b(i) for i=0 to X, unless Q[i] is one of the N−M frozen bit elements, at least one of the input bits index array Q and the sub-block interleaving array J is obtained prior to polar decoding; and
 polar decode the assigned inputs at the polar decoder.

* * * * *